(12) United States Patent
Corisis et al.

(10) Patent No.: US 6,580,158 B2
(45) Date of Patent: *Jun. 17, 2003

(54) HIGH SPEED IC PACKAGE CONFIGURATION

(75) Inventors: David J. Corisis, Meridian, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/071,943

(22) Filed: Feb. 5, 2002

(65) Prior Publication Data

US 2002/0074629 A1 Jun. 20, 2002

Related U.S. Application Data

(60) Continuation of application No. 09/472,291, filed on Dec. 27, 1999, now Pat. No. 6,414,378, which is a continuation of application No. 09/001,638, filed on Dec. 31, 1997, now Pat. No. 6,133,622, which is a division of application No. 08/784,362, filed on Jan. 17, 1997, now Pat. No. 6,103,547.

(51) Int. Cl.[7] .............................................. H01L 23/495
(52) U.S. Cl. ........................................ 257/666; 257/678
(58) Field of Search ................................. 257/666, 676, 257/678, 786

(56) References Cited

U.S. PATENT DOCUMENTS

| 5,147,815 | A | | 9/1992 | Casto |
|---|---|---|---|---|
| 5,214,845 | A | | 6/1993 | King et al. |
| 5,233,220 | A | | 8/1993 | Lamson et al. |
| 5,290,735 | A | | 3/1994 | Haley |
| 5,304,843 | A | | 4/1994 | Takubo et al. |
| 5,358,904 | A | | 10/1994 | Murakami et al. |
| 5,409,866 | A | | 4/1995 | Sato et al. |
| 5,447,888 | A | | 9/1995 | Takashima et al. |
| 5,480,841 | A | | 1/1996 | Bickford et al. |
| 5,559,306 | A | | 9/1996 | Mahulikar |
| 5,583,370 | A | | 12/1996 | Higgins, III et al. |
| 5,766,975 | A | | 6/1998 | Templeton, Jr. et al. |
| 6,414,378 | B1 | * | 7/2002 | Corisis et al. .............. 257/666 |

* cited by examiner

*Primary Examiner*—Roy Potter
(74) *Attorney, Agent, or Firm*—TraskBritt

(57) ABSTRACT

Devices and methods for reducing lead inductance in integrated circuit (IC) packages. More specifically to an integrated circuit package configuration for high speed applications where the inductance of the leads is reduced or minimized in high capacity semiconductor device packages. The integrated circuit package assembly comprises a substrate, semiconductor device, insulating covering or coating, if desired, a semiconductor device retainer, lead frame, and wire bond interconnections.

29 Claims, 11 Drawing Sheets

HIGH SPEED IC PACKAGE CONFIGURATION

CROSS-REFERENCE TO RELATED APPLICATIONS

This application is a continuation of application Ser. No. 09/472,291, filed Dec. 27, 1999, now U.S. Pat. No. 6,414,378, issued July 2, 2002, which is a continuation of application Ser. No. 09/001,638, filed Dec. 31, 1997, now U.S. Pat. No. 6,133,622, issued Oct. 17, 2000, which is a divisional of application Ser. No. 08/784,362, filed Jan. 17, 1997, now U.S. Pat. No. 6,103,547, issued Aug. 15, 2000.

BACKGROUND OF THE INVENTION

1. Field of the Invention

The present invention relates in general to devices and methods for reducing lead inductance in integrated circuit (IC) packages and, more specifically, to an integrated circuit package configuration for high speed applications where the inductance of the leads is reduced or minimized in high capacity semiconductor device packages.

2. State of the Art

Integrated circuit (IC) packages typically contain small, generally rectangular integrated circuits referred to as IC "dice" or "chips." These IC dice come in an almost infinite variety of forms, including, for example, Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice.

Packaged IC dice communicate with circuitry external to their packages through lead frames embedded in the packages. These lead frames generally include an assembly of leads that extend into the packages to connect to bond pads on the IC dice through thin wire bonds or other connecting means and extend from the packages to terminate in pins or other terminals that connect to the external circuitry. Exemplary conventional lead frames include paddle-type wire-bond lead frames, which include a central die support and leads which extend to the perimeter of IC dice and connect to the dice through thin wire bonds, Leads-Over-Chip (LOC) lead frames, having leads which extend over an IC die to attach to and support the die while being electrically connected to the die through wire bonds or other connecting means, and Leads-Under-Chip (LUC) lead frames, having leads which extend under an IC die to attach to and support the die from below while being connected to the die typically through wire bonds.

As with all conductors, the leads in lead frames have an inductance associated with them that increases as the frequency of signals passing through the leads increases. This lead inductance is the result of two interactions: the interaction among magnetic fields created by signal currents flowing to and from an IC die through the leads (known as "mutual" inductance); and the interaction between the magnetic fields created by the signal currents flowing to and from the IC die through the leads and magnetic fields created by oppositely directed currents flowing to and from ground (known as "self" inductance).

While lead inductance in IC packages for memory devices has not traditionally been troublesome because traditionally slow signal frequencies have made the inductance relatively insignificant, the ever-increasing signal frequencies of state of the art electronic systems have made lead inductance in IC packages significant. For example, overall performance of IC dice attached to leads in IC packages is slower than desirable because the inductance associated with the leads slows changes in signal current through the leads, causing signals to take longer to propagate through the leads. Also, digital signals propagating along the leads are dispersing (i.e., "spreading out") because the so-called "Fourier" components of various frequencies that make up the digital signals propagate through the inductance associated with the leads at different speeds, causing the components, and hence the digital signals themselves, to disperse along the leads, while mild dispersion can make the digital signals unrecognizable upon receipt. Impedance mismatches between the leads and IC dice or the leads and external circuitry, caused, in part, by the inductance associated with the leads, can distort normal signals propagating along the leads at the same time as the reflection signals. Further, magnetic fields created by signal currents propagating through the inductance associated with the leads can induce currents in nearby leads, causing so-called "crosstalk" noise on the nearby leads. While these various effects can be troublesome in any electronic system, the modem trend toward 3.3 volt systems and away from 5.0 volt systems only serves to make these effects more noticeable and significant. Also, the trend to ever increasing operating speeds for semiconductor devices further serves to make these effects more noticeable and significant. Particularly, such is present when the use of high density semiconductor devices operating at high frequencies requiring the use of packages having an increased number of connections to the semiconductor device is necessary.

Prior IC packages have been configured in an attempt to reduce various effects of lead inductance as described above. For example, U.S. Pat. No. 5,214,845, assigned to the assignee of the present invention, employs a flexible, laminated sandwich assembly of an outer ground plane and an outer power plane dielectrically isolated from a series of conductive traces running therebetween. The traces and planes are connected to corresponding bond pads on an IC die at one end, and to leads on the other, as by thermocompression bonding (in the case of a TAB embodiment), or by wire bonds. Such an arrangement obviously doubles the number of required I/O connections by requiring two connections for each lead, and thus necessitates additional assembly time and increases the possibility of a faulty connection. Further, the flexible sandwich assembly constitutes an additional element of the package, increasing material cost.

Another approach to reducing the inductance effects described above is disclosed in U.S. Pat. No. 5,559,306, in which metal plates are employed above and below leads extending to the exterior of plastic and ceramic packages to effect reduction of self and mutual inductance. However, such configurations as disclosed appear to require relatively complex fabrication techniques to locate and fix the plates relative to the die and lead fingers or other conductors for subsequent transfer molding of a filled-polymer package thereabout, while the ceramic package embodiment is not cost-effective for high-volume, commercial packaging.

Accordingly, the inventors have recognized the need for a low-cost, reduced-inductance IC package configuration and readily-available materials, equipment, and fabrication techniques for semiconductor devices.

SUMMARY OF THE INVENTION

The present invention relates in general to devices and methods for reducing lead inductance in integrated circuit (IC) packages and, more specifically, to an integrated circuit package configuration for high speed applications where the inductance of the leads is reduced or minimized in high capacity semiconductor device packages. The integrated circuit package of the present invention comprises a substrate, semiconductor device, insulating covering or coating, if desired, a semiconductor device retainer, lead frame, and wire bond interconnections.

The present invention will be better understood when the drawings are taken in conjunction with the specification describing the invention hereafter.

DETAILED DESCRIPTION OF THE INVENTION

Figure 1:
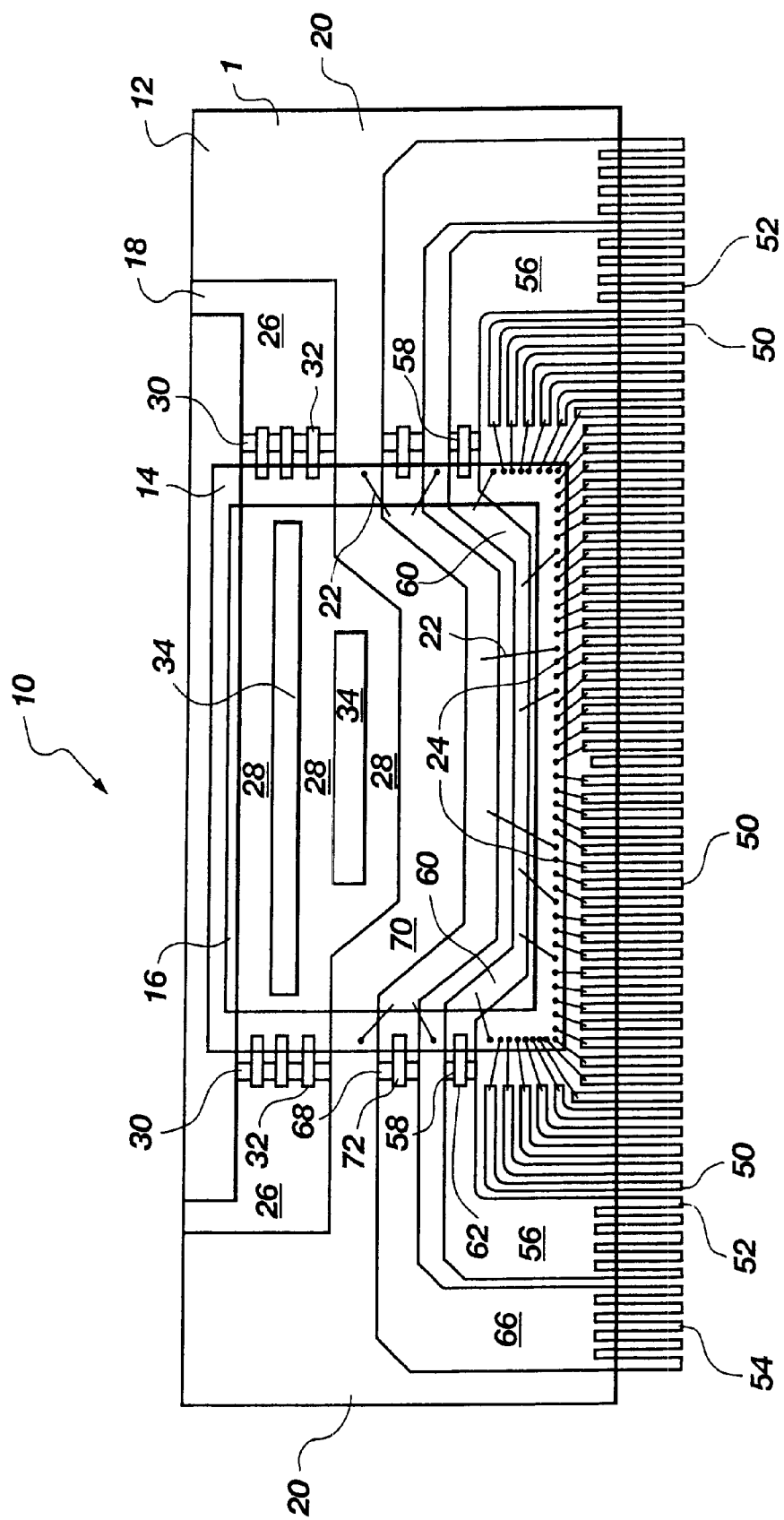
FIG. 1 is a side view of one side of a first embodiment of the present invention mounted in a vertical surface mount package.

Referring to drawing FIG. 1, the first side 1 of the integrated circuit package 10 of the present invention is shown in a vertical surface mount package configuration. The integrated circuit package 10 comprises a substrate 12, semiconductor device 14, insulating tape material 16, semiconductor device retainer 18, lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 (see FIG. 1) on the active surface thereof.

The insulating tape material 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28, one or more slotted openings 32 are included in the semiconductor device retainer 18. If desired, other openings 34 may be included in the second raised portion 28 to aid in the forming thereof. Further, if desired, the second raised portion 28 of the semiconductor device retainer 18 may be adhesively attached to the insulating tape 16 through the use of well known suitable adhesives.

The lead frame 20 comprises a first plurality of leads 50, a second plurality of leads 52 commonly connected over a portion of the length thereof, and a third plurality of leads 54 commonly connected over a portion thereof. As illustrated, the leads of the second plurality of leads 52 are commonly connected, forming a unitary lead including a first portion 56 generally contacting the substrate 12, second transition portion 58 having, in turn, slotted opening 62 therein, and third semiconductor device portion 60. The third semiconductor device portion 60 of the second plurality of leads 52 is insulated from electrical contact with the active surface of the semiconductor device 14 by the insulating tape 16. As illustrated, the leads of the third plurality of leads 54 are commonly connected, forming a unitary lead including a first portion 66 generally contacting the surface of the substrate 12, a second transition portion 68 having slotted opening 72 therein, and third semiconductor device portion 70. The third semiconductor device portion 70 is insulated from the active surface of the semiconductor device 14 by the insulating tape 16. The transition portions 58 and 68 of the second plurality and third plurality of leads 52 and 54 may be any desired length depending upon the thickness of the semiconductor device 14 and the insulating tape 16. The third semiconductor device portions 60 and 70 of the second plurality and third plurality of leads 52 and 54, respectively, are adhesively secured to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality of 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 2:
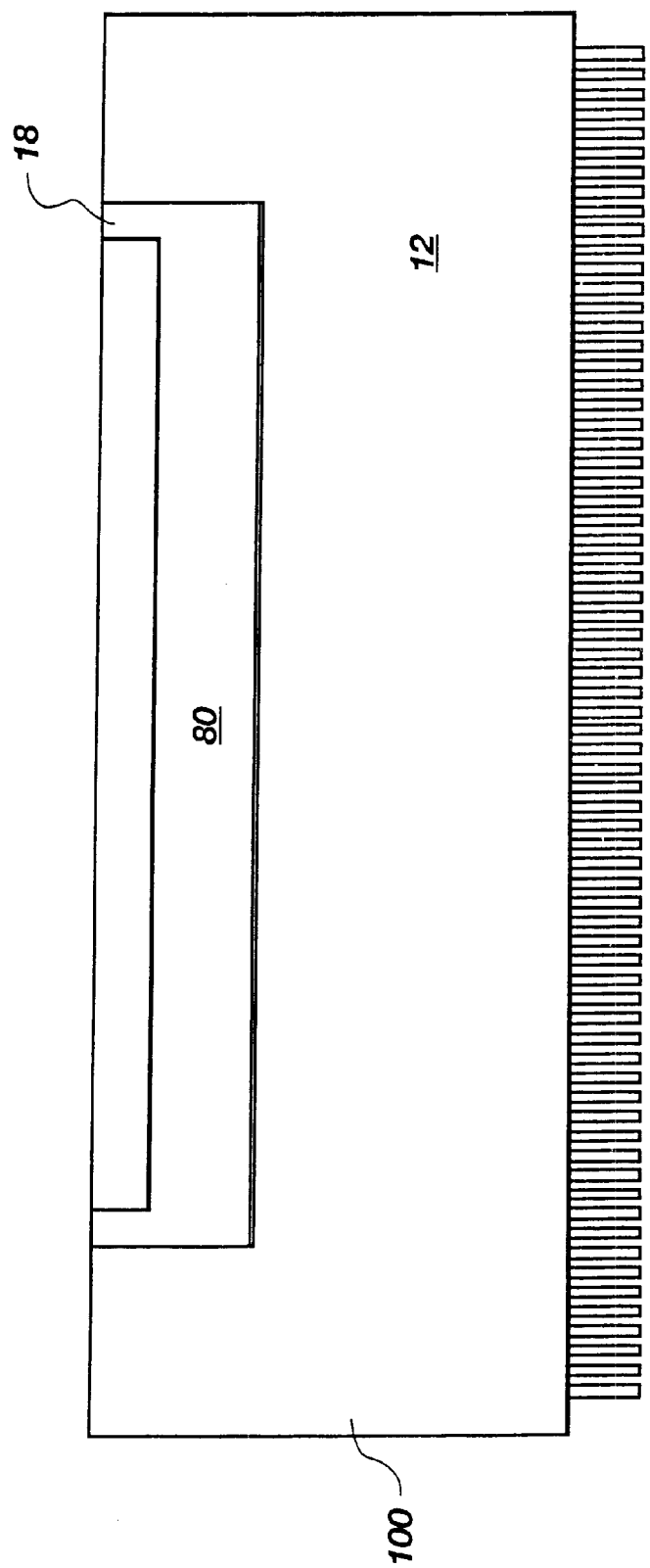
FIG. 2 is a side view of the other side of a first embodiment of the present invention mounted in a vertical surface mount package.

Referring to drawing FIG. 2, the second or other side 100 of the integrated circuit package 10 of the present invention is shown in a vertical surface mount package configuration. The other side of the unshaped semiconductor device retainer 18 is illustrated in relation to the second or other side 100 of the integrated circuit package 10. The portion 80 of the semiconductor device retainer 18 resiliently engages the second side 100 of the substrate 12. If desired, the portion 80 may be secured to the substrate 12, such as by attachment with any suitable well known adhesive material.

Figure 3:
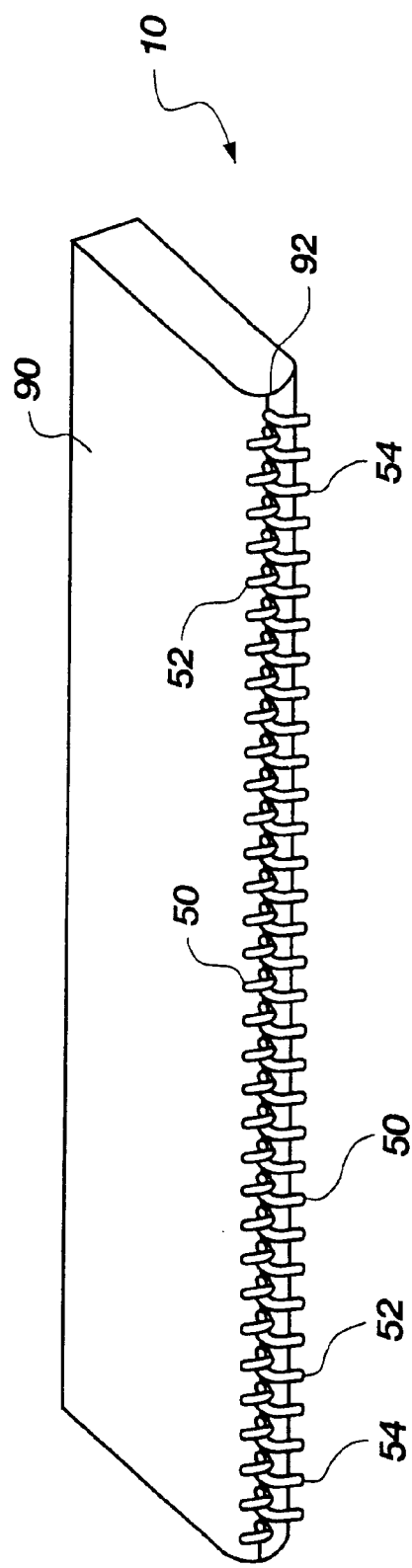
FIG. 3 is a perspective view of the present invention being encapsulated with the connectors of the lead frame extending therefrom.

Referring to drawing FIG. 3, the integrated circuit package 10 of the present invention in a vertical surface mount package configuration is shown encapsulated in encapsulation material 90. The encapsulation material 90 may be of any suitable well known type, such as plastic, plastic with filler material therein, etc. As illustrated, the connectors 50, 52, and 54 extend from the edge 92 of the encapsulating material 90 being deformed in opposite directions thereal-ong for subsequent connection to circuits of a printed circuit board (not shown).

Figure 4:
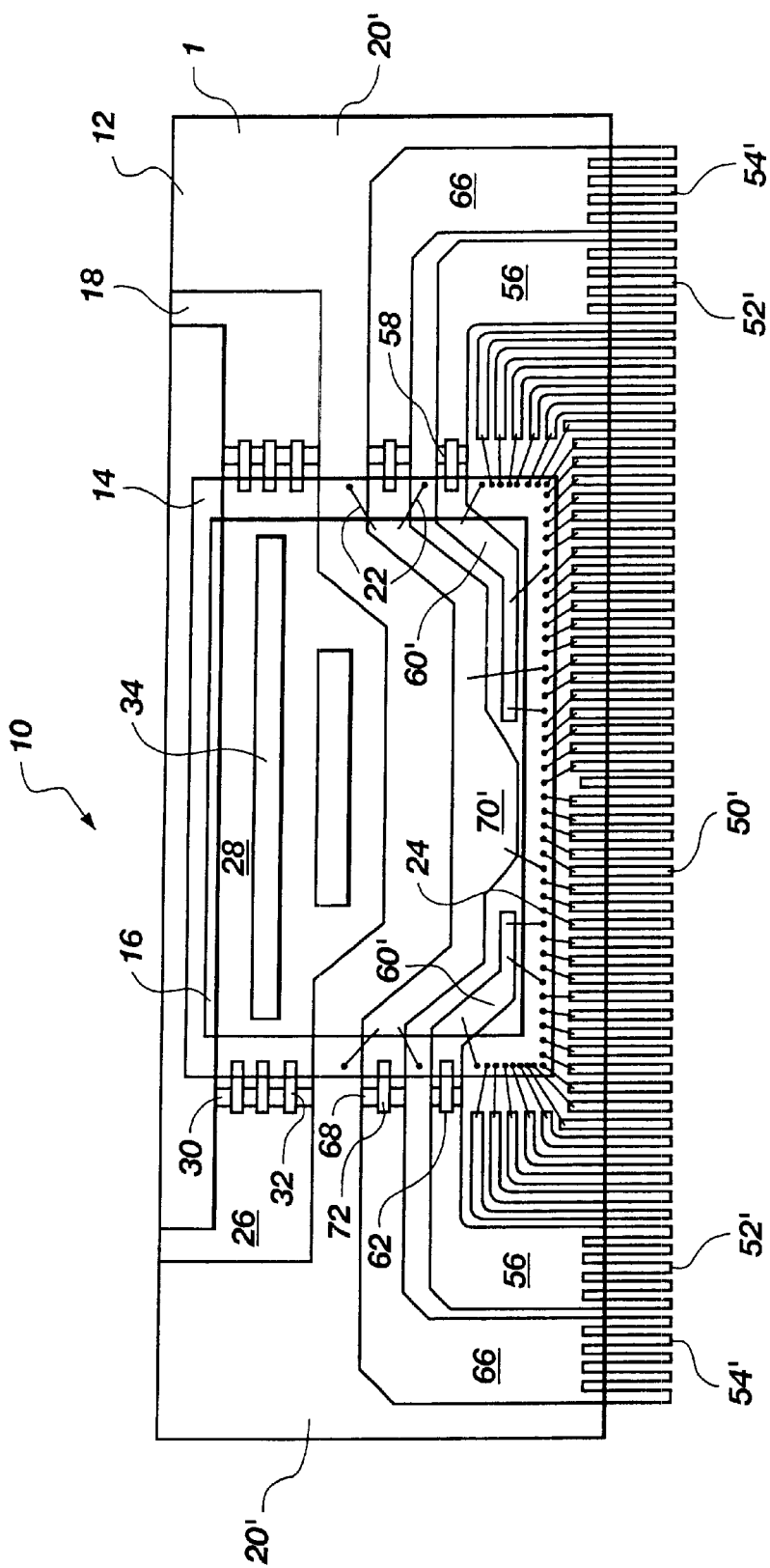
FIG. 4 is a side view of one side of a second embodiment of the present invention mounted in a vertical surface mount package.

Referring to drawing FIG. 4, the first side 1 of a second embodiment of the integrated circuit package 10 of the present invention is shown. The integrated circuit package 10 comprises a substrate 12, semiconductor device 14, insulating tape 16, semiconductor device retainer 18, lead frame 20', and wire bond interconnections 22. As illustrated, the semiconductor device 14 is a Leads-Over-Chip (LOC) configuration with respect to the lead frame 20'.

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 (see FIG. 1) on the active surface thereof.

The insulating tape 16 comprises any suitable well known type insulating tape which may be adhesively coated to secure portions of the lead frame 20' thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28, one or more slotted openings 32 are included in the semiconductor device retainer 18. If desired, other openings 34 may be included in the second raised portion 28 to aid in the forming thereof. Further, if desired, the second raised portion 28 of the semiconductor device retainer 18 may be adhesively attached to the insulating tape 16 through the use of well known suitable adhesives.

The lead frame 20' comprises a first plurality of leads 50' (see FIG. 4), a second plurality of leads 52' commonly connected over a portion of the length thereof, and a third plurality of leads 54' commonly connected over a portion thereof. As illustrated, the second plurality of leads 52' is commonly connected, forming a unitary lead including a first portion 56 generally contacting the substrate 12, second transition portion 58 having, in turn, slotted opening 62 therein, and third semiconductor device portions 60' which terminate at a distance overlaying a portion of the semiconductor device 14. The third semiconductor device portions 60' of the second plurality of leads 52' are insulated from electrical contact with the active surface of the semiconductor device 14 by the insulating tape 16. As illustrated, the third plurality of leads 54' is commonly connected, forming a unitary lead including a first portion 66 generally contacting the surface of the substrate 12, a second transition portion 68 having slotted opening 72 therein, and third semiconductor device portion 70' which has a portion thereof extending adjacent and/or in between the ends of the third semiconductor device portions 60' of the leads 52'. The third semiconductor device portion 70' is insulated from the active surface of the semiconductor device 14 by the insulating tape 16. The transition portions 58 and 68 of the second plurality and third plurality of leads 52' and 54', respectively, may be any desired length depending upon the thickness of the semiconductor device 14 and the insulating tape 16. The third semiconductor device portions 60' and 70' of the second plurality and third plurality of leads 52' and 54', respectively, are adhesively secured to the insulating tape 16 through the use of well known suitable adhesives.

As illustrated, the second plurality of leads 52' and third plurality of leads 54' are used for the $V_{cc}$ and $V_{ss}$ functions of the semiconductor device 14. In this manner, by commonly connecting the second plurality of leads 52' and third plurality of leads 54' in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52' and third plurality of leads 54' in areas except the portions of the leads which extend beyond the substrate 12, the impedance of the second plurality 52' and third plurality 54' of leads is similar to that of the first plurality of leads 50.

A plurality of wire bond interconnections 22 interconnect the bond pads 24 on the active surface of the semiconductor device 14 and the first 50', second 52', and third 54' pluralities of leads. The wire bond interconnections 22 are made using suitable well known wire bonding devices.

Figure 5:
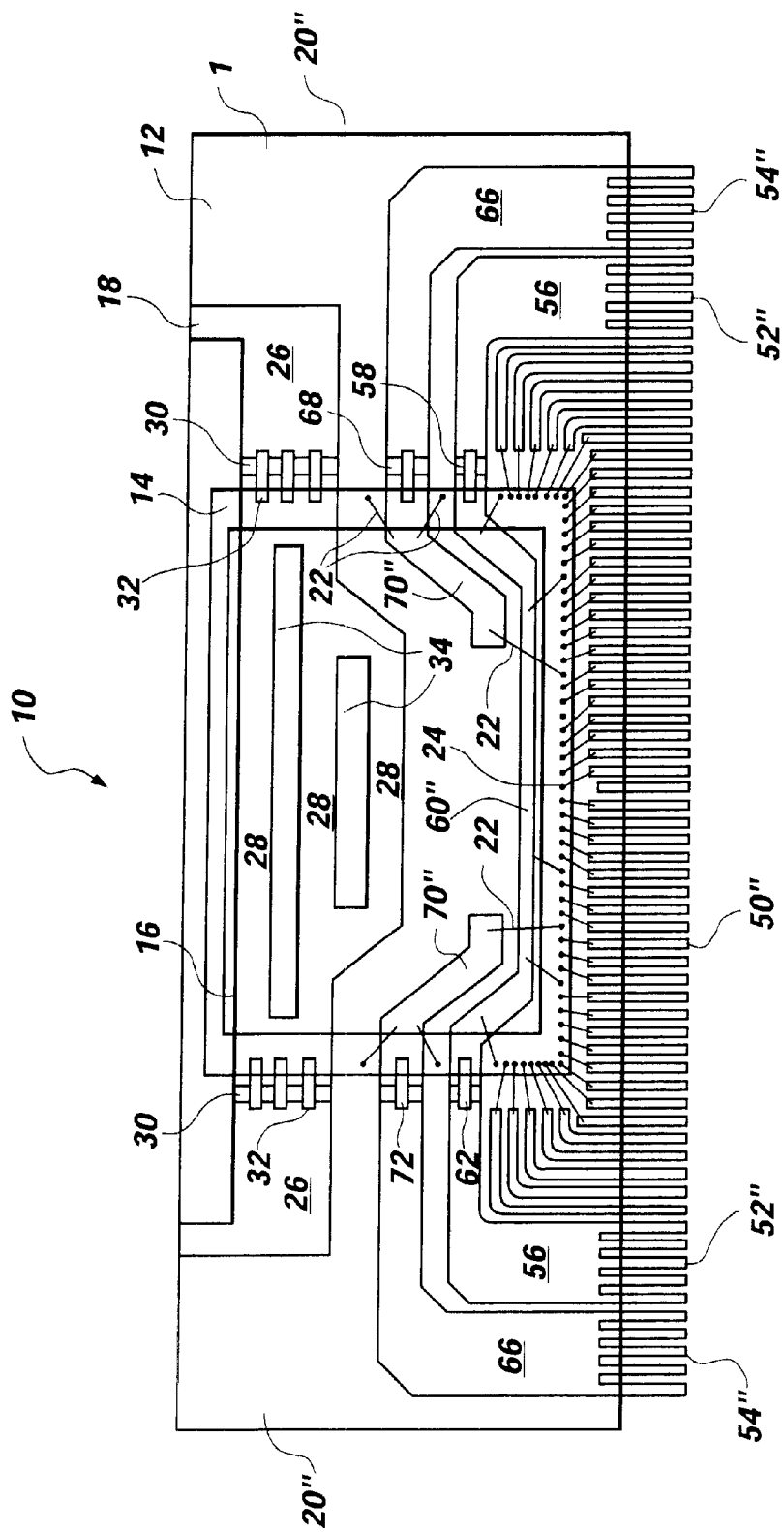
FIG. 5 is a side view of one side of a third embodiment of the present invention mounted in a vertical surface mount package.

Referring to drawing FIG. 5, the first side 1 of a third embodiment of the integrated circuit package 10 of the present invention is shown. The integrated circuit package 10 comprises a substrate 12, semiconductor device 14, insulating tape material 16, semiconductor device retainer 18, lead frame 20", and wire bond interconnections 22. As illustrated, the semiconductor device 14 is a Leads-Over-Chip (LOC) configuration with respect to the lead frame 20".

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20" thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28, one or more slotted openings 32 are included in the semiconductor device retainer 18. If desired, other openings 34 may be included in the second raised portion 28 to aid in the forming thereof. Further, if desired, the second raised portion 28 of the semiconductor device retainer 18 may be adhesively attached to the insulating tape 16 through the use of well known suitable adhesives.

The lead frame 20" comprises a first plurality of leads 50", a second plurality of leads 52" commonly connected over a portion of the length thereof, and a third plurality of leads 54" commonly connected over a portion thereof. As illustrated, the second plurality of leads 52" is commonly connected, forming a unitary lead including a first portion 56 generally contacting the substrate 12, second transition portion 58 having, in turn, slotted opening 62 therein, and third semiconductor device portion 60" overlaying a portion of the semiconductor device 14. The third semiconductor device portion 60" of the second plurality of leads 52" is insulated from electrical contact with the active surface of the semiconductor device 14 by the insulating tape 16. As illustrated, the third plurality of leads 54" is commonly connected, forming a unitary lead including a first portion 66 generally contacting the surface of the substrate 12, a second transition portion 68 having slotted opening 72 therein, and third semiconductor device portions 70" which have a portion thereof extending adjacent the portion 60" of the leads 52". The third semiconductor device portions 70" are insulated from the active surface of the semiconductor device 14 by the insulating tape 16. The second transition portions 58 and 68 of the second plurality and third plurality of leads 52" and 54", respectively, may be any desired length depending upon the thickness of the semiconductor device 14 and the insulating tape 16. The third semiconductor device portions 60" and 70" of the second plurality and third plurality of leads 52" and 54", respectively, are adhesively secured to the insulating tape 16 through the use of well known suitable adhesives.

As illustrated, the second plurality of leads 52" and third plurality of leads 54" are used for the $V_{cc}$ and $V_{ss}$ functions of the semiconductor device 14. In this manner, by commonly connecting the second plurality of leads 52" and third plurality of leads 54" in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52" and third plurality of leads 54" in areas except the portions of the leads which extend beyond the substrate 12, the impedance of the second plurality 52" and third plurality 54" of leads is similar to that of the first plurality of leads 50".

A plurality of wire bond interconnections 22 interconnect the bond pads 24 on the active surface of the semiconductor device 14 and the first 50", second 52", and third 54" pluralities of leads. The wire bond interconnections 22 are made using suitable well known wire bonding devices.

Figure 6:
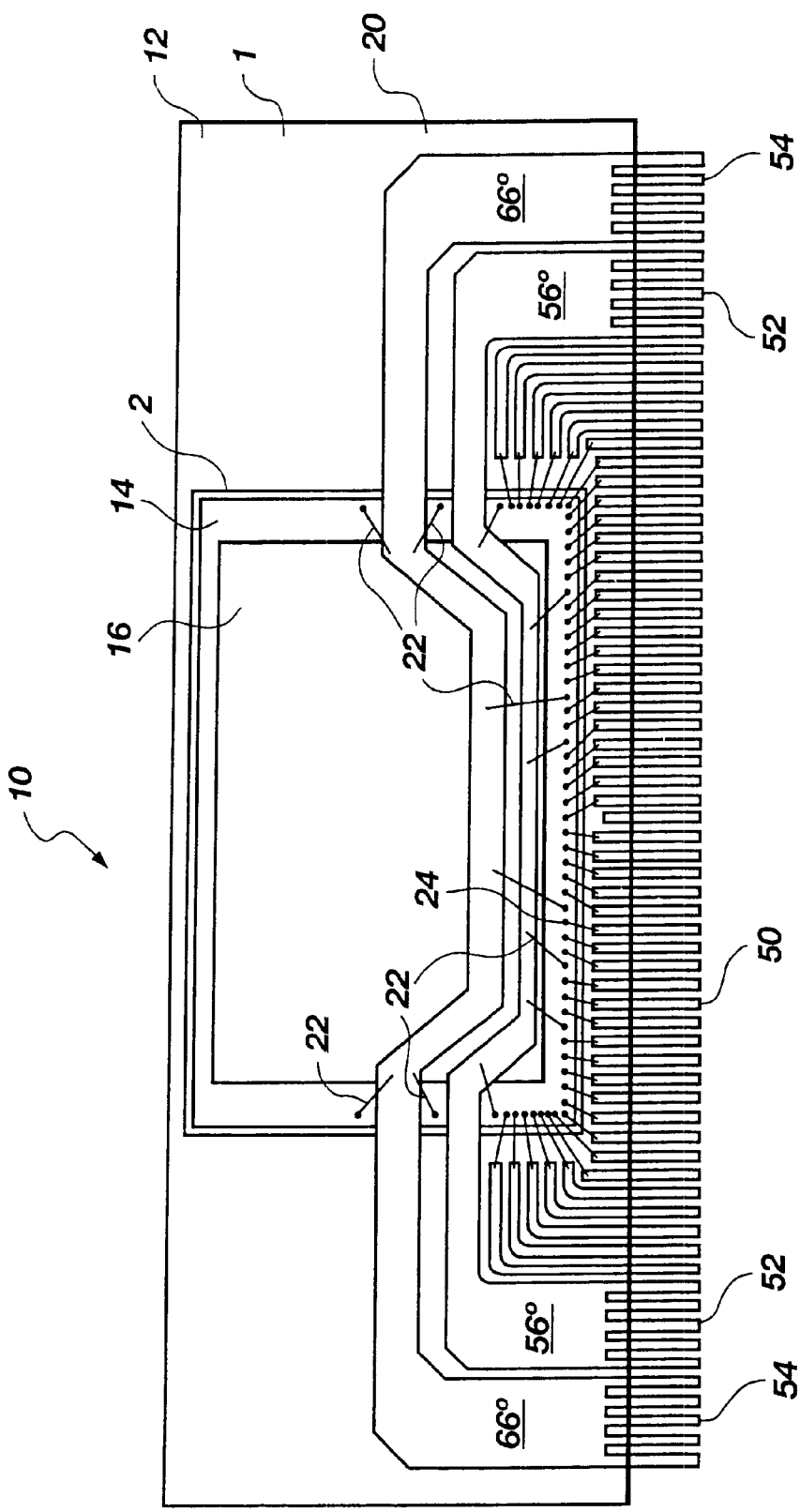
FIG. 6 is a side view of one side of a fourth embodiment of the present invention mounted in a vertical surface mount package.

Referring to drawing FIG. 6, the first side 1 of a fourth embodiment of the integrated circuit package 10 of the present invention is shown. The integrated circuit package 10 comprises a substrate 12, semiconductor device 14, insulating tape material 16, semiconductor device retainer 118 (shown in FIG. 7), lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof. The insulating tape 16 extends over any desired portion of the active surface of the semiconductor device 14 for electrical insulation purposes of the active surface from the lead frame 20.

The lead frame 20 comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a unitary lead including a first portion 56° generally overlaying a portion of the semiconductor device 14. The first portion 56° of the second plurality of leads 52 is insulated from electrical contact with the active surface of the semiconductor device 14 by the insulating tape 16. As illustrated, the third plurality of leads 54 is commonly connected, forming a unitary lead including a first portion 66° generally overlaying a portion of the semiconductor device 14. The first semiconductor device portion 66° is insulated from the active surface of the semiconductor device 14 by the insulating tape 16. The portions 56° and 66° of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 7:
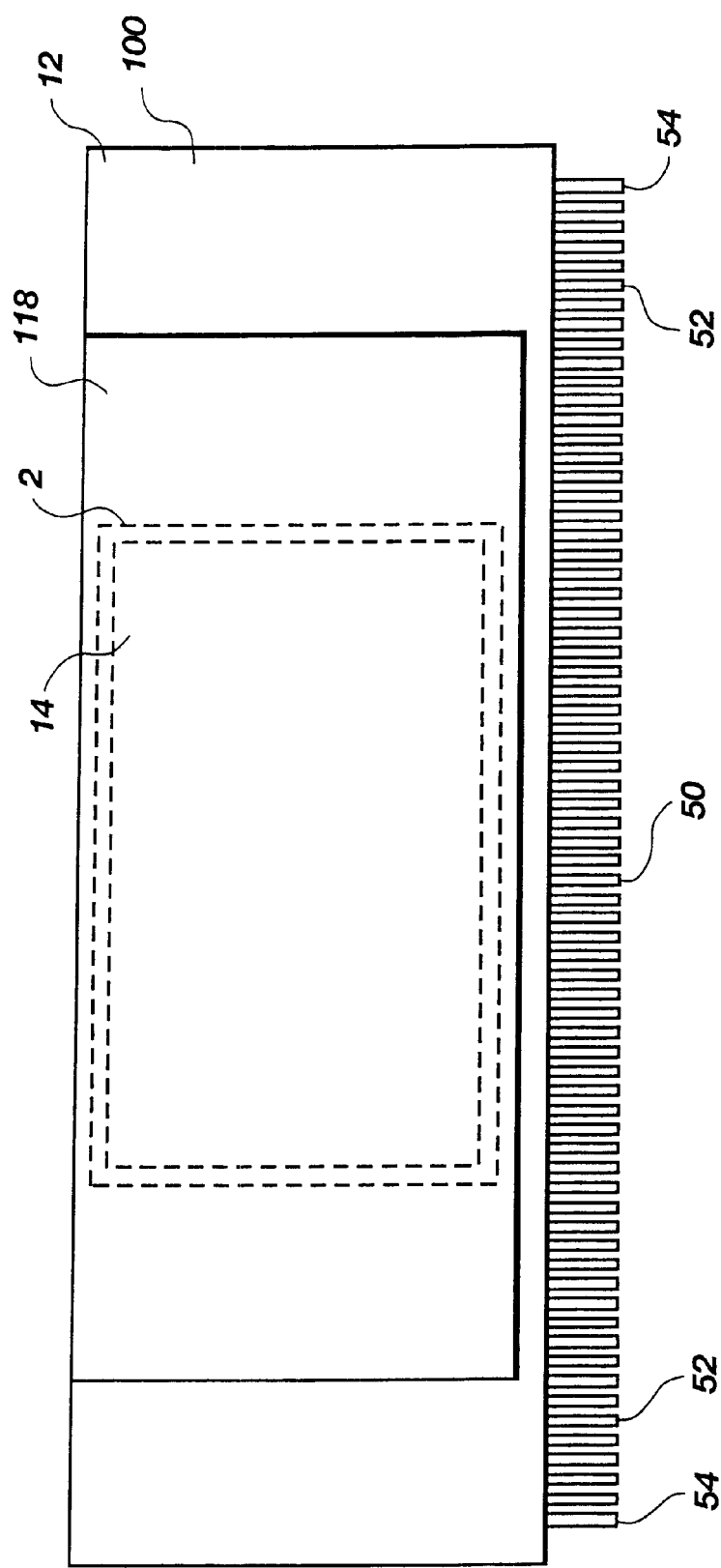
FIG. 7 is a side view of the other side of the fourth embodiment of the present invention mounted in a vertical surface mount package.

Referring to drawing FIG. 7, the second or other side 100 of the integrated circuit package 10 of the present invention shown in drawing FIG. 6 is illustrated. The semiconductor device retainer 118 to which the semiconductor device 14 is mounted through the use of suitable well known adhesives is illustrated in relation to the second or other side 100 of the integrated circuit package 10 and the aperture 2 therethrough. The semiconductor device retainer 118 is adhesively secured to the other side 100 of the integrated circuit package 10 by means of suitable well known adhesives. The semiconductor device retainer 118 may be made of any suitable material, such as metal, plastic, ceramic, etc. When the semiconductor retainer device is used as a heat sink for the semiconductor device 14 to conduct heat therefrom during operation, the semiconductor device is preferably made of a compatible metal or ceramic having a coefficient of expansion comparable to that of the semiconductor device 14. For such purposes, a silver epoxy may be used to adhesively secure the semiconductor device to the semiconductor device retainer 118.

Figure 8:
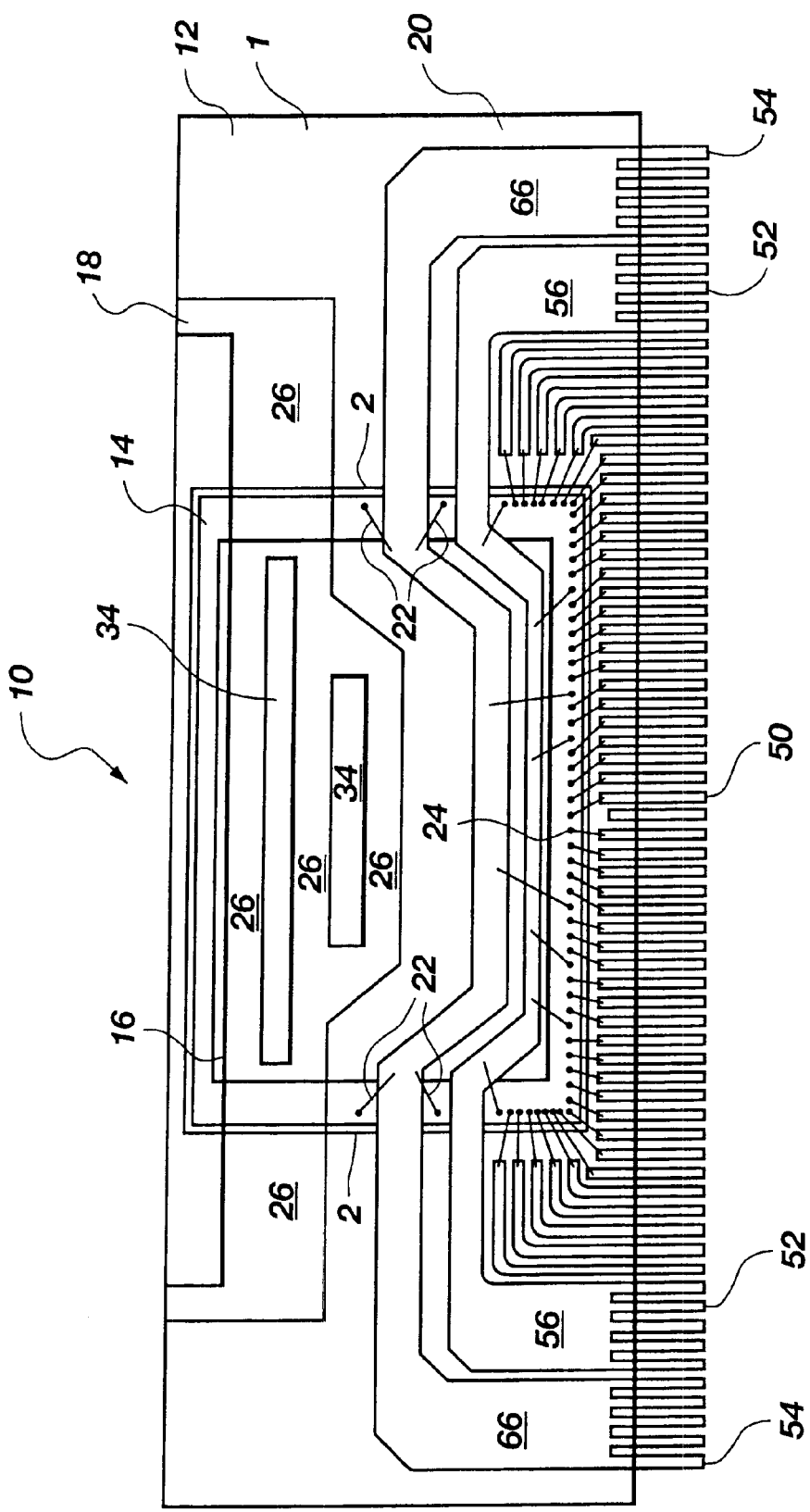
FIG. 8 is a side view of one side of a fifth embodiment of the present invention mounted in a vertical surface mount package.

Referring to drawing FIG. 8, the first side 1 of a fifth embodiment of the integrated circuit package 10 of the present invention is shown. The integrated circuit package 10 comprises a substrate 12, semiconductor device 14, insulating tape material 16, semiconductor device retainer 18, lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof. The insulating tape 16 extends over any desired portion of the active surface of the semiconductor device 14 for electrical insulation purposes of the active surface from the lead frame 20.

The semiconductor device retainer 18 comprises a u-shaped member having a first portion 26 thereof extending along the first side of the substrate 12 in contact therewith and extending over a portion of the semiconductor device 14 having insulating tape 16 thereon. To aid in forming the first portion 26, one or more slotted openings 34 are included in the semiconductor device retainer 18. Further, if desired, the first portion 26 of the semiconductor device retainer 18 may be adhesively attached to the insulating tape 16 through the use of well known suitable adhesives. The portion (not shown in FIG. 8) of the semiconductor device retainer 18 contacting side 100 of the substrate 12 is as shown and described as semiconductor device retainer 118 in drawing FIG. 7.

The lead frame 20 comprises a first plurality of leads 50 secured to substrate 12 by any suitable well known means, such as adhesive bonding, a second plurality of leads 52 commonly connected over a portion of the length thereof, and a third plurality of leads 54 commonly connected over a portion thereof. As illustrated, the second plurality of leads 52 is commonly connected, forming a unitary lead including a first portion 56 generally overlaying a portion of the semiconductor device 14. The first portion 56 of the second plurality of leads 52 is insulated from electrical contact with the active surface of the semiconductor device 14 by the insulating tape 16. As illustrated, the third plurality of leads 54 is commonly connected, forming a unitary lead including a first portion 66 generally overlaying a portion of the semiconductor device 14. The first semiconductor device portion 66 is insulated from the active surface of the semiconductor device 14 by the insulating tape 16. The portions 56 and 66 of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 9:
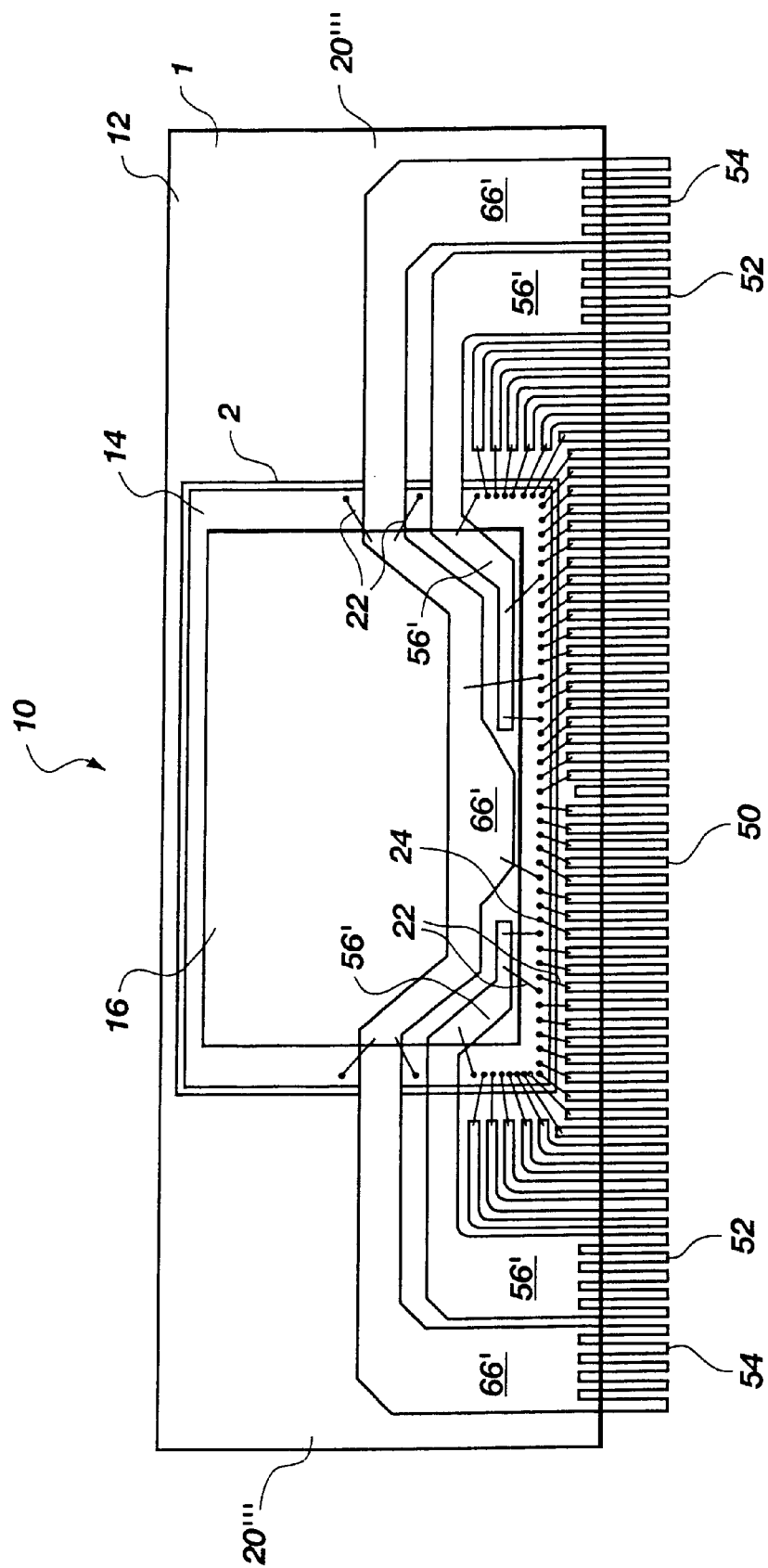
FIG. 9 is a side view of one side of a sixth embodiment of the present invention mounted in a vertical surface mount package.

Referring to drawing FIG. 9, the first side 1 of a sixth embodiment of the integrated circuit package 10 of the present invention is shown. The integrated circuit package 10 comprises a substrate 12, semiconductor device 14, insulating tape material 16, semiconductor device retainer 118 (see FIG. 7), lead frame 20''', and wire bond interconnections 22. As illustrated, the semiconductor device 14 is a modified Leads-Over-Chip (LOC) configuration with respect to the lead frame 20'''.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20''' thereto and the insulating tape 16 to the semiconductor device 14. A suitable type insulating tape includes Kapton™ tape which may be adhesively coated on one or both sides thereof.

The lead frame 20''' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a unitary lead including a first portion 56' generally overlaying a portion of substrate 12 and the semiconductor device 14. The first portion 56' of the second plurality of leads 52 is insulated from electrical contact with the active surface of the semiconductor device 14 by the insulating tape 16. As illustrated, the third plurality of leads 54 is commonly connected, forming a unitary lead including a first portion 66' generally overlaying a portion of the substrate 12 and the semiconductor device 14. The first semiconductor device portion 66' is insulated from the active surface of the semiconductor device 14 by the insulating tape 16. The portions 56' and 66' of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 10:
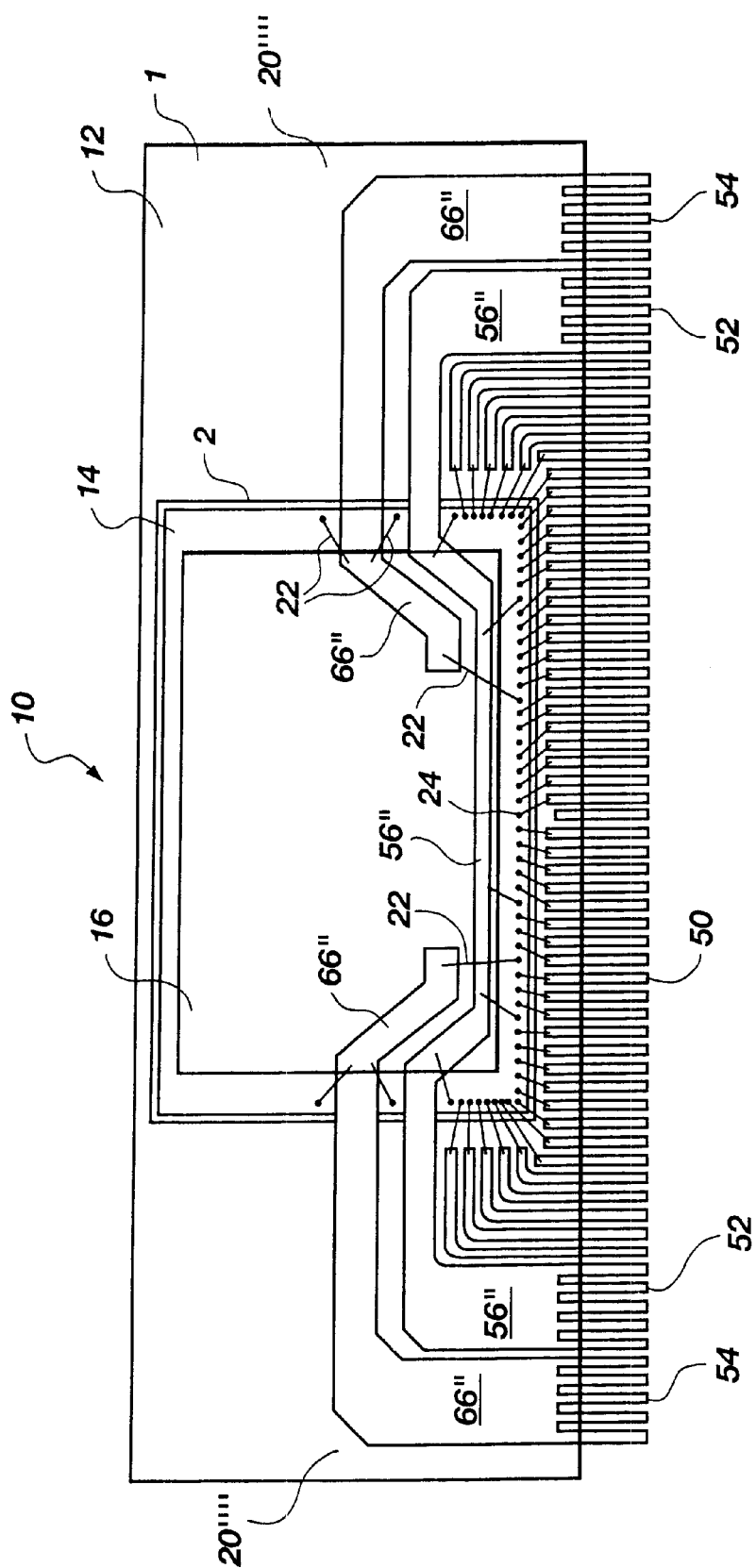
FIG. 10 is a side view of one side of a seventh embodiment of the present invention mounted in a vertical surface mount package.

Referring to drawing FIG. 10, the first side 1 of a seventh embodiment of the integrated circuit package 10 of the present invention is shown. The integrated circuit package 10 comprises a substrate 12, semiconductor device 14, insulating tape material 16, semiconductor device retainer 118 (see FIG. 7), lead frame 20'''', and wire bond interconnections 22. As illustrated, the semiconductor device 14 is a modified Leads-Over-Chip (LOC) configuration with respect to the lead frame 20''''.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20'''' thereto and the insulating tape 16 to the semiconductor device 14. A suitable type insulating tape includes Kapton™ tape which may be adhesively coated on one or both sides thereof.

The lead frame 20'''' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a lead including a first portion 56'' generally overlaying a portion of substrate 12 and the semiconductor device 14. The first portion 56'' of the second plurality of leads 52 is insulated from electrical contact with the active surface of the semiconductor device 14 by the insulating tape 16. As illustrated, the third plurality of leads 54 is commonly connected, forming a lead including a first portion 66'' generally overlaying a portion of the substrate 12 and the semiconductor device 14. The first semiconductor device portion 66'' is insulated from the active surface of the semiconductor device 14 by the insulating tape 16. The portions 56'' and 66'' of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 11:
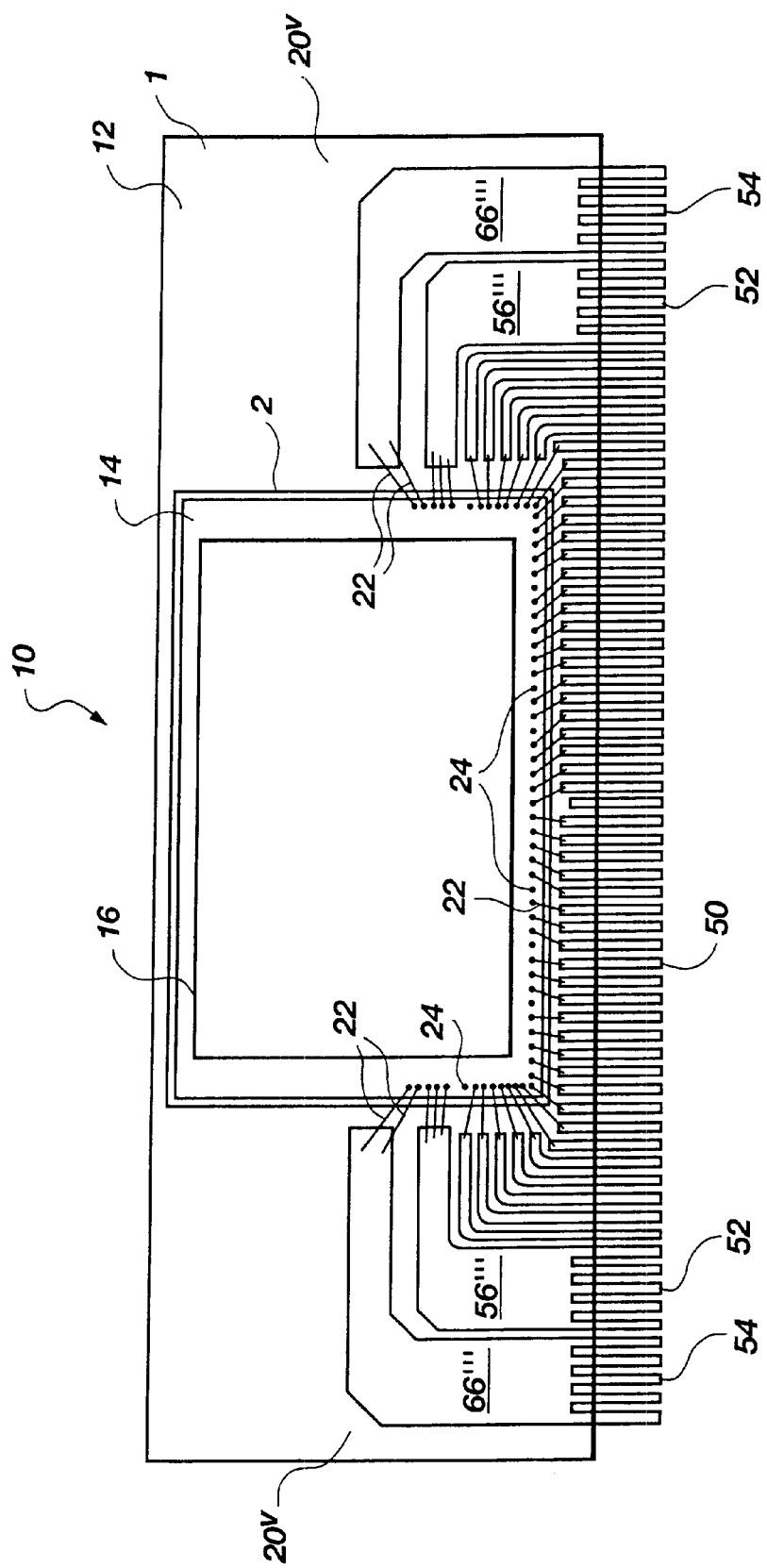
FIG. 11 is a side view of one side of an eighth embodiment of the present invention mounted in a vertical surface mount package.

Referring to drawing FIG. 11, the first side 1 of an eighth embodiment of the integrated circuit package 10 of the present invention is shown. The integrated circuit package 10 comprises a substrate 12, semiconductor device 14, insulating covering or coating 16 on the semiconductor device 14, semiconductor device retainer 118 (see FIG. 7), lead frame 20$^Y$, and wire bond interconnections 22. As illustrated, the semiconductor device 14 is a conventional lead frame configuration with respect to the lead frame 20$^Y$.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating covering or coating 16 comprises any suitable well known type insulating covering (tape) or coating, such as spun-on-glass, which may be attached or coated to portions of the semiconductor device 14. A suitable type insulating tape includes Kapton™ tape which may be adhesively coated on one or both sides thereof.

The lead frame 20$^Y$ comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a lead including a first portion 56''' generally overlaying a portion of substrate 12. The first portion 56''' of the second plurality of leads 52, if desired, may be insulated from electrical contact with the substrate 12 by any well known suitable means. As illustrated, the third plurality of leads 54 is commonly connected, forming a lead including a first portion 66''' generally overlaying a portion of the substrate 12. The first semiconductor device portion 66''' is insulated from the surface of the substrate 12 by any suitable well known means. The portions 56''' and 66''' of the second plurality and third plurality of leads 52 and 54, respectively, may be adhesively secured to the substrate, if desired, through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

From the foregoing it will be understood that changes, additions, deletions, and modifications may be made to the present invention hereinbefore described which fall within the scope of the claimed invention, such as the shape of the lead frame, shape of the semiconductor device, location of bond pads on the semiconductor device, the common unitary portions of the leads terminating over the semiconductor device, the common unitary portions of the leads terminating adjacent the semiconductor device, etc.

What is claimed is:

1. A semiconductor package assembly comprising:
a substrate having a first side and a second side thereof;
a semiconductor device located on the substrate, the semiconductor device having an active surface and at least one bond pad located thereon;
insulation material covering a portion of the active surface of the semiconductor device, the insulation material including tape having an adhesive layer;
a semiconductor device retainer retaining the semiconductor device regarding the substrate, the semiconductor device retainer having a portion engaging a portion of the first side of the substrate, a portion engaging a portion of the second side of the substrate, and a portion engaging a portion of the tape on a portion of the active surface of the semiconductor device;
a lead frame having at least one lead thereon; and
at least one electrical interconnection between the at least one lead of the lead frame and the at least one bond pad of the semiconductor device.

2. The semiconductor package assembly of claim 1, wherein the semiconductor device is substantially mounted on one of the first side and the second side of the substrate.

3. The semiconductor package assembly of claim 1, wherein the substrate contains an aperture therein.

4. The semiconductor package assembly of claim 3, wherein the semiconductor device comprises a device retained within the aperture in the substrate.

5. The semiconductor device package assembly of claim 4, wherein the semiconductor device retainer engages a portion of the tape and a portion of the active surface of the semiconductor device and a portion of the substrate.

6. The semiconductor package assembly of claim 5, wherein the semiconductor device retainer engages a portion of the tape and the active surface of the semiconductor device and a portion of the second side of the substrate.

7. The semiconductor package assembly of claim 6, wherein the semiconductor device comprises a device attached to the semiconductor device retainer.

8. The semiconductor package assembly of claim 1, wherein the semiconductor device includes a memory device.

9. The semiconductor package assembly of claim 1, wherein the semiconductor device includes a processor.

10. The semiconductor package assembly of claim 1, wherein the active surface of the semiconductor device includes an insulating material covering a portion of the active surface of the semiconductor device comprising spun-on-glass.

11. The semiconductor package assembly of claim 10, wherein the insulating material covering a portion of the active surface of the semiconductor device includes insulative tape adhesively coated on both sides thereof.

12. The semiconductor package assembly of claim 1, wherein the lead frame includes a first plurality of leads, a second plurality of leads, and a third plurality of leads.

13. The semiconductor package assembly of claim 1, wherein the lead frame includes a first plurality of leads, a second plurality of leads, and a third plurality of leads, the second plurality of leads having a portion thereof connected together.

14. The semiconductor package assembly of claim 1, wherein the lead frame includes a first plurality of leads, a second plurality of leads, and a third plurality of leads, the third plurality of leads having a portion thereof connected together.

15. The semiconductor package assembly of claim 1, wherein the lead frame includes a first plurality of leads, a second plurality of leads having a portion thereof connected together, and a third plurality of leads having a portion thereof connected together.

16. The semiconductor package assembly of claim 1, wherein the lead frame includes a first plurality of leads, a second plurality of leads having a portion thereof connected together to form a substantially unitary lead, and a third plurality of leads having a portion thereof connected together to form a substantially unitary lead, at least a portion of the substantially unitary lead of the second plurality of leads and a portion of the substantially unitary lead of the third plurality of leads extending over a portion of the active surface of the semiconductor device.

17. The semiconductor package assembly of claim 1, wherein the lead frame includes a first plurality of leads, a second plurality of leads having a portion thereof connected together to form a substantially unitary lead terminating adjacent the semiconductor device, and a third plurality of leads having a portion thereof connected together to form a substantially unitary lead terminating adjacent the semiconductor device.

18. The semiconductor package assembly of claim 1, wherein the lead frame includes a first plurality of leads, a second plurality of leads having a portion thereof connected together to form a substantially unitary lead, a portion of the substantially unitary lead of the second plurality of leads extending over a portion of the semiconductor device and terminating thereover, and a third plurality of leads having a portion thereof connected together to form a substantially unitary lead, a portion of the substantially unitary lead of the third plurality of leads extending over a portion of the active surface of the semiconductor device.

19. The semiconductor package assembly of claim 1, wherein the lead frame includes a first plurality of leads, a second plurality of leads having a portion thereof connected together to form a substantially unitary lead, the substantially unitary lead of the second plurality of leads extending over a portion of the semiconductor device, and a third plurality of leads having a portion thereof connected together to form a substantially unitary lead, a portion of the substantially unitary lead of the third plurality of leads extending over a portion of the active surface of the semiconductor device and terminating thereover.

20. The semiconductor package assembly of claim 1, wherein the lead frame includes a first plurality of leads, a second plurality of leads having a portion thereof connected together overlaying a portion of the semiconductor device, and a third plurality of leads having a portion thereof connected together overlaying a portion of the semiconductor device.

21. The semiconductor package assembly of claim 1, wherein the lead frame includes a first plurality of leads terminating adjacent the semiconductor device, a second plurality of leads having a portion thereof connected together overlaying a portion of the semiconductor device, and a third plurality of leads having a portion thereof connected together overlaying a portion of the semiconductor device.

22. A semiconductor die package assembly comprising:

a substrate having a first side and a second side thereof;

a semiconductor die located on one of the first side and the second side of the substrate, the semiconductor die having an active surface and a plurality of bond pads located thereon;

insulation material covering a portion of the active surface of the semiconductor die;

a semiconductor retainer device retaining the semiconductor die on the substrate, the semiconductor device retainer engaging a portion of the active surface of the semiconductor die and a portion of the second side of the substrate;

a lead frame having a plurality of leads thereon; and a plurality of electrical interconnections between the plurality of leads of the lead frame and the plurality of bond pads of the semiconductor die.

23. A semiconductor die package assembly comprising:

a substrate having a first side and a second side thereof;

a semiconductor die located on one of the first side and the second side of the substrate, the semiconductor die having an active surface and a plurality of bond pads located thereon;

insulation material covering a portion of the active surface of the semiconductor die;

a semiconductor retainer device retaining the semiconductor die on the substrate, the semiconductor device retainer engaging a portion of the insulation material covering a portion of the active surface of the semiconductor die and engaging a portion of the first side and the second side of the substrate;

a lead frame having a plurality of leads thereon; and a plurality of electrical interconnections between the plurality of leads of the lead frame and the plurality of bond pads of the semiconductor die.

24. A semiconductor die package assembly comprising:

a substrate having a first side and a second side thereof;

a semiconductor die located on one of the first side and the second side of the substrate, the semiconductor die having an active surface and a plurality of bond pads located thereon;

insulation material covering a portion of the active surface of the semiconductor die;

a semiconductor retainer device retaining the semiconductor die on the substrate, the semiconductor retainer device engaging a portion of the second side of the substrate and engaging a portion of the active surface of the semiconductor die;

a lead frame having a plurality of leads thereon including a first plurality of leads, a second plurality of leads having a portion thereof connected together to form a substantially unitary lead, and a third plurality of leads having a portion thereof connected together to form a substantially unitary lead, at least a portion of the substantially unitary lead of the second plurality of leads and a portion of the substantially unitary lead of the third plurality of leads extending over a portion of the active surface of the semiconductor die; and a plurality of electrical interconnections between the plurality of leads of the lead frame and the plurality of bond pads of the semiconductor die.

25. A semiconductor die package assembly comprising:

a substrate having a first side and a second side thereof;

a semiconductor die located on one of the first side and the second side of the substrate, the semiconductor die having an active surface and a plurality of bond pads located thereon;

insulation material covering a portion of the active surface of the semiconductor die;

a semiconductor retainer device retaining the semiconductor die on the substrate, the semiconductor retainer device engaging a portion of the second side of the substrate and a portion of the active surface of the semiconductor die;

a lead frame having a plurality of leads thereon including a first plurality of leads, a second plurality of leads having a portion thereof connected together to form a substantially unitary lead terminating adjacent the semiconductor die, and a third plurality of leads having a portion thereof connected together to form a substantially unitary lead terminating adjacent the semiconductor die; and a plurality of electrical interconnections between the plurality of leads of the lead frame and the plurality of bond pads of the semiconductor die.

26. A semiconductor die package assembly comprising:

a substrate having a first side and a second side thereof;

a semiconductor die located on one of the first side and the second side of the substrate, the semiconductor die having an active surface and a plurality of bond pads located thereon;

insulation material covering a portion of the active surface of the semiconductor die;

a semiconductor retainer device retaining the semiconductor die on the substrate, the semiconductor retainer device engaging a portion of the second side of the substrate and engaging a portion of the active surface of the semiconductor die;

a lead frame having a plurality of leads thereon including a first plurality of leads, a second plurality of leads having a portion thereof connected together to form a substantially unitary lead, a portion of the substantially unitary lead of the second plurality of leads extending over a portion of the semiconductor die and terminating thereover, and a third plurality of leads having a portion thereof connected together to form a substantially unitary lead, a portion of the substantially unitary lead of the third plurality of leads extending over a portion of the active surface of the semiconductor die; and a plurality of electrical interconnections between the plurality of leads of the lead frame and the plurality of bond pads of the semiconductor die.

27. A semiconductor die package assembly comprising:

a substrate having a first side and a second side thereof;

a semiconductor die located on one of the first side and the second side of the substrate, the semiconductor die having an active surface and a plurality of bond pads located thereon;

insulation material covering a portion of the active surface of the semiconductor die;

a semiconductor retainer device retaining the semiconductor die on the substrate, the semiconductor retainer device engaging a portion of the second side of the substrate and engaging a portion of the active surface of the semiconductor die;

a lead frame having a plurality of leads thereon including a first plurality of leads, a second plurality of leads having a portion thereof connected together to form a substantially unitary lead, the substantially unitary lead of the second plurality of leads extending over a portion of the semiconductor die, and a third plurality of leads having a portion thereof connected together to form a substantially unitary lead, a portion of the substantially unitary lead of the third plurality of leads extending over a portion of the active surface of the semiconductor die and terminating thereover; and a plurality of electrical interconnections between the plurality of leads of the lead frame and the plurality of bond pads of the semiconductor die.

28. A semiconductor die package assembly comprising:

a substrate having a first side and a second side thereof;

a semiconductor die located on one of the first side and the second side of the substrate, the semiconductor die having an active surface and bond pads located thereon;

insulation material covering a portion of the active surface of the semiconductor die;

a semiconductor retainer device retaining the semiconductor die on the substrate, the semiconductor retainer device engaging a portion of the second side of the substrate and a portion of the active surface of the semiconductor die;

a lead frame having a plurality of leads thereon including a first plurality of leads, a second plurality of leads having a portion thereof connected together overlaying a portion of the semiconductor die, and a third plurality of leads having a portion thereof connected together overlaying a portion of the semiconductor die; and a plurality of electrical interconnections between the plurality of leads of the lead frame and the bond pads of the semiconductor die.

29. A semiconductor die package assembly comprising:

a substrate having a first side and a second side thereof;

a semiconductor die located on one of the first side and the second side of the substrate, the semiconductor die having an active surface and bond pads located thereon;

insulation material covering a portion of the active surface of the semiconductor die;

a semiconductor retainer device retaining the semiconductor die on the substrate, the semiconductor retainer device engaging a portion of the second side of the substrate and a portion of the active surface of the semiconductor die;

a lead frame having a plurality of leads thereon including a first plurality of leads terminating adjacent the semiconductor die, a second plurality of leads having a portion thereof connected together overlaying a portion of the semiconductor die, and a third plurality of leads having a portion thereof connected together overlaying a portion of the semiconductor die; and a plurality of electrical interconnections between the plurality of leads of the lead frame and the bond pads of the semiconductor die.

* * * * *

UNITED STATES PATENT AND TRADEMARK OFFICE
CERTIFICATE OF CORRECTION

PATENT NO.    : 6,580,158 B2
DATED         : June 17, 2003
INVENTOR(S)   : David J. Corisis and Brent Keeth It is certified that error appears in the above-identified patent and that said Letters Patent is hereby corrected as shown below:

Column 2,
Line 22, change "modem" to -- modern --

Column 3,
Line 58, after "tape" delete "material"

Column 4,
Line 10, after "tape" delete "material"
Line 21, change "thereof 30" to -- 30 thereof --

Column 5,
Line 6, before "54" insert -- insert --; after "54" delete "of leads"
Line 16, change "unshaped" to -- u-shaped --
Line 28, change "connectors" to -- pluralities of leads --
Line 29, change "encapsulating" to -- encapsulation --
Line 67, change "thereof 30" to -- 30 thereof --

Column 6,
Line 57, change "50" to -- 50' --
Line 67, before "16" delete "material"

Column 7,
Line 18, before "16" delete "material"
Line 29, change "thereof 30" to -- 30 thereof --

Column 11,
Line 8, delete "material"
Line 27, before "16" delete "material"

Column 12,
Lines 10 and 29, before "16" delete "material"

Column 13,
Line 12, change "coating" to -- tape --
Line 31, change "coating" to -- tape --

UNITED STATES PATENT AND TRADEMARK OFFICE
CERTIFICATE OF CORRECTION

PATENT NO. : 6,580,158 B2
DATED : June 17, 2003
INVENTOR(S) : David J. Corisis and Brent Keeth It is certified that error appears in the above-identified patent and that said Letters Patent is hereby corrected as shown below:

Column 16,
Lines 17, 34 and 52, change "retainer device" to -- device retainer --
Lines 53-54, change "retainer device" to -- device retainer --

Column 17,
Lines 14 and 38, change "retainer device" to -- device retainer --
Lines 15-16, change "retainer device" to -- device retainer --
Lines 39-40, change "retainer device" to -- device retainer --

Column 18,
Lines 1, 27 and 48, change "retainer device" to -- device retainer --
Lines 2-3, change "retainer device" to -- device retainer --
Lines 28-29, change "retainer device" to -- device retainer --
Lines 49-50, change "retainer device" to -- device retainer --

Signed and Sealed this

Third Day of February, 2004

JON W. DUDAS
*Acting Director of the United States Patent and Trademark Office*